(12) United States Patent
Sumi et al.

(10) Patent No.: US 8,046,907 B2
(45) Date of Patent: Nov. 1, 2011

(54) ELECTRONIC COMPONENT PLACEMENT METHOD

(75) Inventors: Hideki Sumi, Fukuoka (JP); Takahiro Noda, Fukuoka (JP)

(73) Assignee: Panasonic Corporation, Osaka (JP)

( * ) Notice: Subject to any disclaimer, the term of this patent is extended or adjusted under 35 U.S.C. 154(b) by 306 days.

(21) Appl. No.: 11/916,473

(22) PCT Filed: Aug. 16, 2006

(86) PCT No.: PCT/JP2006/316438
§ 371 (c)(1),
(2), (4) Date: Dec. 4, 2007

(87) PCT Pub. No.: WO2007/021026
PCT Pub. Date: Feb. 22, 2007

(65) Prior Publication Data
US 2009/0100672 A1    Apr. 23, 2009

(30) Foreign Application Priority Data
Aug. 19, 2005    (JP) .................................. 2005-238166

(51) Int. Cl.
*B23P 19/00*    (2006.01)

(52) U.S. Cl. ................. 29/739; 29/740; 29/830; 29/831; 29/832; 29/833

(58) Field of Classification Search .................... 29/739, 29/740, 832, 833, 834; 294/64.1, 2; 414/737, 414/752
See application file for complete search history.

(56) References Cited

U.S. PATENT DOCUMENTS

| 5,911,456 | A | * | 6/1999 | Tsubouchi et al. | ............. 29/833 |
| 6,154,954 | A | * | 12/2000 | Seto et al. | ........................ 29/740 |
| 6,216,341 | B1 | * | 4/2001 | Nakahara | ......................... 29/833 |
| 6,918,176 | B2 | * | 7/2005 | Nagao et al. | ..................... 29/832 |
| 2004/0128827 | A1 | * | 7/2004 | Shimizu et al. | ................. 29/739 |

FOREIGN PATENT DOCUMENTS

| DE | 10157226 | 10/2002 |
| EP | 1231829 | 8/2002 |
| EP | 1476006 | 11/2004 |
| JP | 08-097595 | 4/1996 |
| JP | 2001-053494 A | 2/2001 |
| JP | 2003-243890 A | 8/2003 |

OTHER PUBLICATIONS

Japanese Office Action dated Apr. 16, 2009.
International Search Report Dated Nov. 23, 2006.

* cited by examiner

*Primary Examiner* — Derris Banks
*Assistant Examiner* — Tai Nguyen
(74) *Attorney, Agent, or Firm* — Pearne & Gordon LLP (57) ABSTRACT

In an electronic component placement method in which electronic components are picked up from a plurality of component supply sections which supply electronic components using a plurality of mounting heads which are provided corresponding to the respective component supply sections, and the electronic components are transferred and mounted on a substrate in a same placing stage, in performing the component transferring and mounting operations, head interference areas which constitute exclusive operating regions to which only the specified mounting heads are allowed to access are set for every placing turn. Due to such a constitution, in the component placement operation, it is possible to rationally set the accessible region without causing the interference of one mounting head with another mounting head thus shortening a placing tact time by excluding wasteful standby times of the mounting heads.

11 Claims, 8 Drawing Sheets

ELECTRONIC COMPONENT PLACEMENT METHOD

TECHNICAL FIELD

The present invention relates to an electronic component placement method which picks up electronic components from a component supply section using a mounting head and places the electronic components on a substrate which is positioned on a placing stage.

BACKGROUND ART

In an electronic component placement device which places electronic components on a substrate, electronic components which are stored in a component supply section are picked up by a mounting head which is provided with a suction nozzle, and are transferred to a position above the substrate and are mounted on predetermined placement points. As a type of such an electronic component placement device, there has been known an electronic component placement device which is configured such that component supply sections are arranged on both sides of a placing stage which positions a substrate, and electronic components from the respective component supply sections are picked up using a plurality of mounting heads which are independently operable and are transferred and mounted to the substrate (for example, see patent document 1), for example. By adopting such a constitution, the mounting operation can be performed in parallel simultaneously using the plurality of mounting heads and hence, it is possible to obtain an advantageous effect that the placing efficiency is enhanced.

[Patent Document 1] Japanese Patent Laid-open H08-97595

DISCLOSURE OF INVENTION

However, even in such an electronic component placement device which includes plural mounting heads, the respective mounting heads are not completely allowed to freely perform the mounting operation irrelevant to each other and various restricting conditions exist. For example, when the mounting heads are moved above the substrate to which the electronic components are placed, to prevent the interference among the mounting heads, an access to only one mounting head is allowed at the same timing and hence, other mounting heads are required to stand by at predetermined retracted positions. Accordingly, in the mounting operation, a wasteful time is generated attributed to the standby of the mounting heads thus leading to a delay of a placing tact time.

Accordingly, it is an object of the present invention to provide an electronic component placement method which can efficiently perform placing of electronic components on a substrate which is arranged on the same placing stage using a plurality of mounting heads.

The present invention is directed to an electronic component placement method in which electronic components are picked up from a plurality of component supply sections which supply electronic components using a plurality of mounting heads which are provided corresponding to the respective component supply sections, and the electronic components are transferred and mounted on a substrate in a same placing stage, wherein in performing the component transferring and mounting operations using the mounting heads, in the placing stage, processing for setting an exclusive operating region which allows an access of only specific mounting heads out of the plurality of mounting heads is executed.

According to the present invention, in performing the component transferring and mounting operation using the mounting heads, by executing the processing for setting the exclusive operating region which allows the access of only specific mounting heads out of the plurality of mounting heads in the placing stage, it is possible to rationally perform the setting of the region to which one mounting head is accessible without interfering with other mounting heads in the component mounting operation whereby the placing tact time can be shortened by eliminating the wasteful standby time of the mounting head.

BEST MODE FOR CARRYING OUT THE INVENTION

Next, embodiments of the present invention are explained in conjunction with attached drawings.

Figure 1:
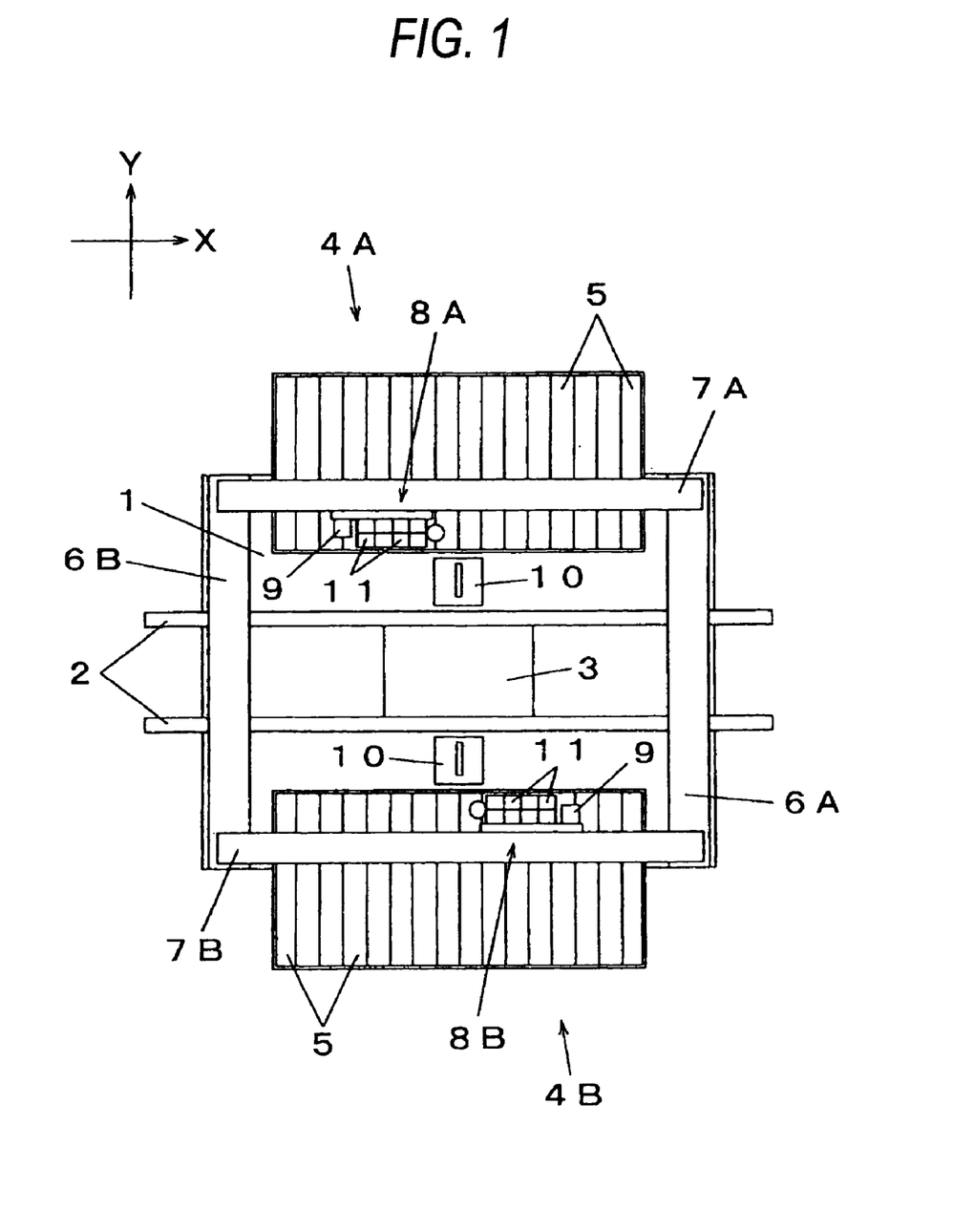
FIG. 1 is a plan view of an electronic component placement device according to one embodiment of the present invention.

Firstly, the structure of the electronic component placement device is explained in conjunction with FIG. 1. In FIG. 1, on a center portion of a base 1, a transporting passage 2 is arranged in the X direction (the substrate transporting direction). The transporting passage 2 transports a substrate 3 which is carried from an upstream side and positions the substrate 3 on a placing stage. On both sides of the transporting passage 2, a plurality of (two in this embodiment) component supply sections 4A and 4B is arranged, wherein on each component supply section 4A or 4B, a plurality of rows of tape feeders 5 which constitute component feeders are arranged. The tape feeder 5 supplies electronic components by feeding a carrier tape which holds the electronic components thereon pitch by pitch.

On both end portions of the upper surface of the base 1, Y-axis tables 6A and 6B are arranged, while on the Y-axis tables 6A and 6B, two X-axis tables 7A and 7B are extended. By driving the Y-axis table 6A, the X-axis table 7A moves horizontally in the Y direction and by driving the Y-axis table 6B, the X-axis table 7B moves horizontally in the Y direction. On the X-axis tables 7A and 7B, mounting heads 8A, 8B (hereinafter, respectively abbreviated as a A head 8A and a B head 8B) and substrate recognition cameras 9 which integrally move with these mounting heads 8A, 8B are respectively placed.

By driving the X-axis table 6A and the Y-axis table 7A, the A head 8A moves horizontally, picks up the electronic components from the component supply section 4A by using suction nozzles 14 (see FIG. 2), and places the electronic components on the substrate 3 which is positioned on the transporting passage 2. In the same manner, by driving the X-axis table 6B and the Y-axis table 7B, the B head 8B picks up the electronic components from the component supply section 4B and places the electronic components on the substrate 3 which is positioned on the transporting passage 2. That is, the A head 8A and the B head 8B are arranged so as to respectively correspond to a plurality of component supply sections 4A and 4B which supply the electronic components.

The substrate recognition cameras 9 which are moved onto the substrate 3 together with the A head 8A and the B head 8B respectively image and recognize the substrate 3. Further, on passages from the component supply sections 4A and 4B to the transporting passage 2, component recognition cameras 10 are arranged. When the A head 8A and the B head 8B which pick up the electronic components from the component supply sections 4A and 4B are moved to the substrate 3 which is positioned on the placing stage, and the electronic components which are held by the nozzles 14 are moved in the X direction on the upper portion of the component recognition cameras 10 during the movement of the head 8A and 8B, the component recognition cameras 10 image the electronic components held by the nozzles 14. Further, the result of the imaging is recognized and processed by a recognition processing section (not shown in the drawing) so that positions of the electronic components in the state of being held by the nozzles 14 are recognized and, at the same time, kinds of the electronic components are identified.

Figure 2:
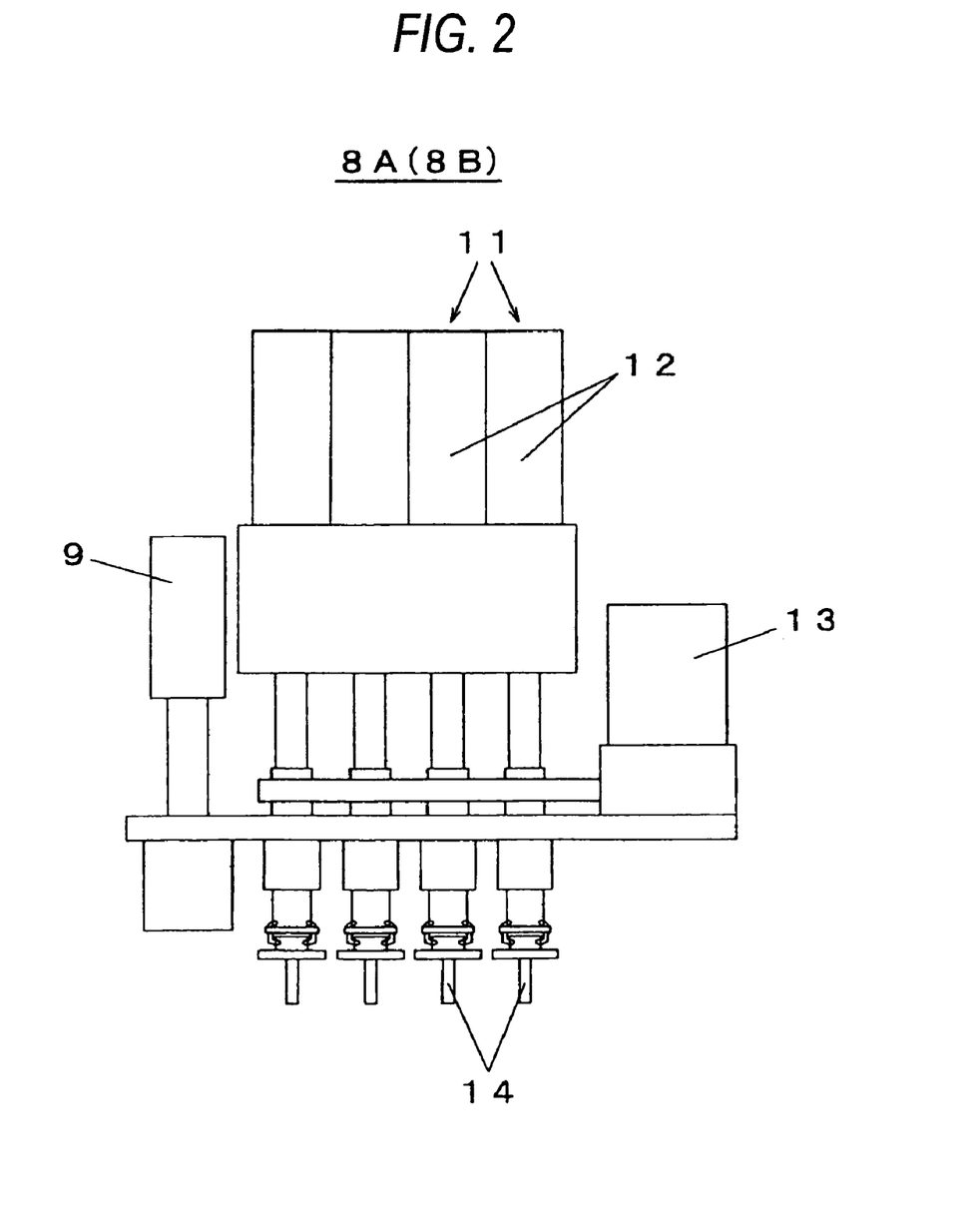
FIG. 2 is a constitutional explanatory view of a mounting head of the electronic component placement device according to one embodiment of the present invention.

Next, the mounting head 8 is explained in conjunction with FIG. 2. As shown in FIG. 2, the A head 8A and the B head 8B are of a multiple head type and each head includes a plurality of unit mounting heads 11. These unit mounting heads 11 detachably place nozzles 14 which suck and hold the electronic components on respective lower portions thereof, wherein the nozzles 14 can be exchanged corresponding to kinds of electronic components. Further, the A head 8A and the B head 8B include a common θ axis motor 13 which allows the rotation about nozzle shafts in the respective unit mounting heads 11. Further, the respective unit mounting heads 11 include respective Z axis motors 12 for elevating the respective nozzles and hence, nozzles 14 can be individually elevated or lowered.

Figure 3:
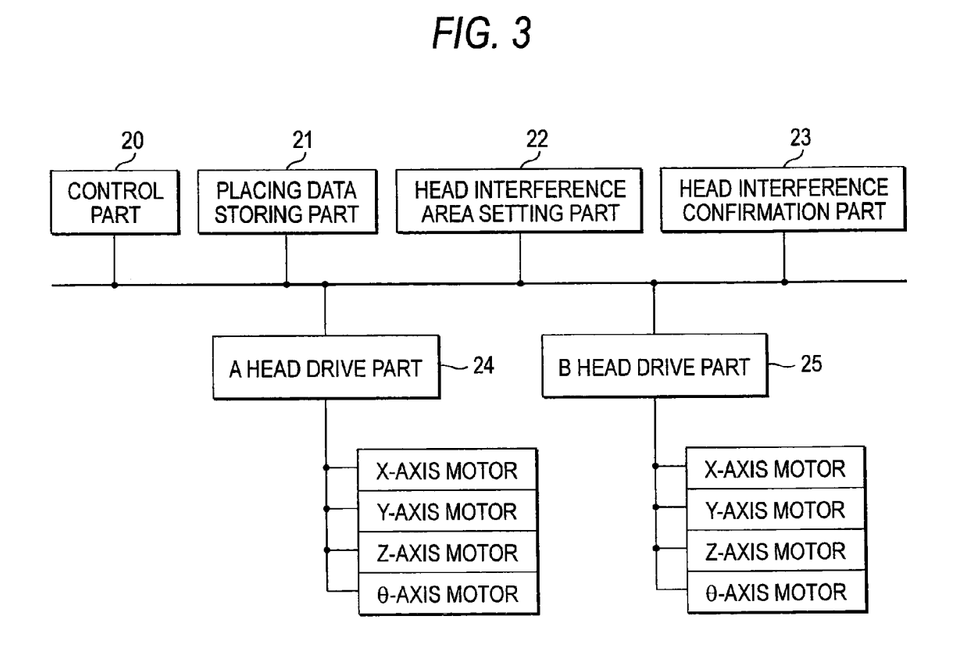
FIG. 3 is a block diagram showing the constitution of a control system of the electronic component placement device according to one embodiment of the present invention.

Next, the constitution of a control system of the electronic component placement device is explained in conjunction with FIG. 3. In FIG. 3, a control part 20 is constituted of a CPU and controls an operation of the whole electronic component placement device. A placing data storing part 21 stores, together with substrate information such as a kind, a size and the like of the substrate 3, component information such as a kind, a size and the like of the electronic components which are placed on the substrate 3, and placing data such as component mounting position information indicating placing points of respective parts on the substrate 3.

A head interference area setting part 22 executes processing for setting a head interference area, that is, an exclusive operating region which allows an access of only specific mounting heads out of the A head 8A and the B head 8B on a placing stage described later prior to the start of the placing operation in which the electronic components are picked up from the plurality of component supply sections 4A, 4B using the A head 8A and the B head 8B and the electronic components are transferred and mounted on the substrate 3 in the same placing stage arranged at the transporting passage 2.

A head interference confirmation part 23 performs processing for confirming whether there is a possibility that the A head 8A and the B head 8B advance to positions above the same placing stage, and in the component mounting operation for mounting the electronic components on the substrate 3, the mounting heads interfere with each other or not. This processing is performed for every one placing turn, that is, every reciprocating operation in which the mounting heads pick up the electronic components from the component supply section and place the electronic components on the substrate, wherein the processing is performed by determining whether the placing points which are commanded in the placing turn belong to the head interference area in the operational timing or not.

A head drive part 24 and a B head drive part 25 drive, based on commands from the control part 20, the A head 8A and the B head 8B. That is, the A head drive part 24, the B head drive part 25 drive the drive motors (X-axis motor, Y-axis motor) of the X-axis table and the Y-axis table for horizontal movement of the respective mounting heads, the Z-axis motors 12 which elevate or lower the nozzles 14 in response to the respective unit mounting heads 11, and the θ-axis motor 13 which is provided in common for respective mounting heads.

Next, the head interference area is explained. When the plurality of mounting heads which are moved independently possess one placing stage in common, when the setting of an operational sequence is not proper, the positional interference is generated between the mounting heads thus giving rise to a drawback such as braking of the device. To prevent such a drawback, in this embodiment, a planar range in which the positional interference may be generated between the plurality of mounting heads is set as the head interference area.

Then, in performing the operational control of the A head 8A and the B head 8B by the control part 20, the head interference area is consulted as an exclusive operating region which allows the access of only the specific mounting head out of two heads, that is, the A head 8A and the B head 8B thus preventing two mounting heads from advancing into the exclusive operating region at the same timing.

Figure 4:
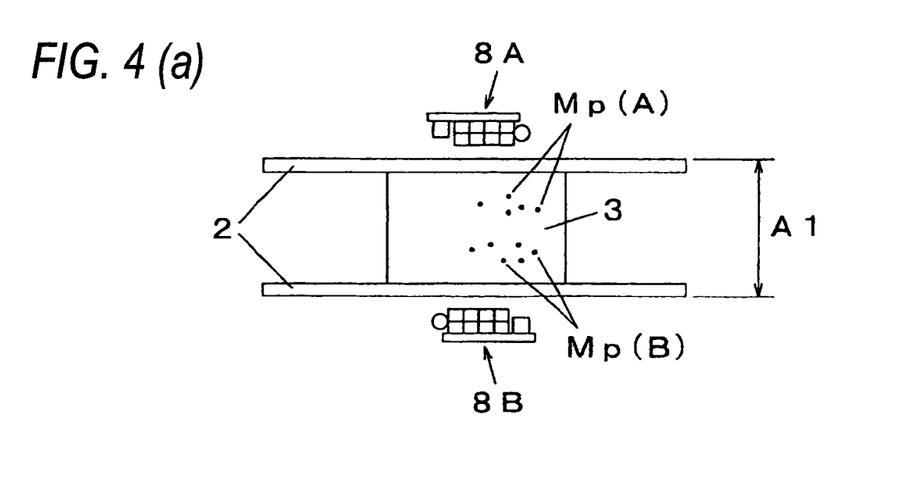
FIG. 4 is an explanatory view of an exclusive operating region of the electronic component placement device according to one embodiment of the present invention.

The setting of the head interference area may selectively adopt various modes, wherein three kinds of examples are explained hereinafter in this embodiment. First of all, FIG. 4 shows an example in which the whole surface of the substrate 3 which is transported to the transporting passage 2 is set as the head interference area. In FIG. 4(a), the substrate 3 is positioned on the placing stage of the transporting passage 2, and a plurality of component placement points is set on the substrate 3. These component placement points are constituted of placing points Mp (A) on which the components are placed by the A head 8A and the placing points Mp (B) on which the components are placed by the B head 8B. Here, a width range which adds widths of rails of the transporting passage 2 to the whole width of the substrate 3 is set as the head interference area A1. Here, the range of the width 3 without including the widths of the rails of the transporting passage 2 may be set as the head interference area A1.

When the interference area A1 is set in this manner, in the component transfer and mounting operation which transfers and mounts the electronic components on the same substrate 3 using the A head 8A and the B head 8B, the advancement of two mounting heads into the head interference area A1 at the same timing is not allowable in view of an operational control. For example, as shown in FIG. 4(b), when the B head 8B performs the mounting of the components within the head interference area A1, the A head 8A is not allowed to advance into the head interference area A1 and hence, the A head 8A stands by outside the head interference area A1. Then, as shown in FIG. 4(c), after the B head 8B is retracted from the head interference area A1, the advancement of the A head 8A into the head interference area A1 is allowed. That is, in this example, the head interference area A1 which constitutes the exclusive operating region is set based on the size information of the substrate 3 which is transported to the placing stage.

Figure 5:
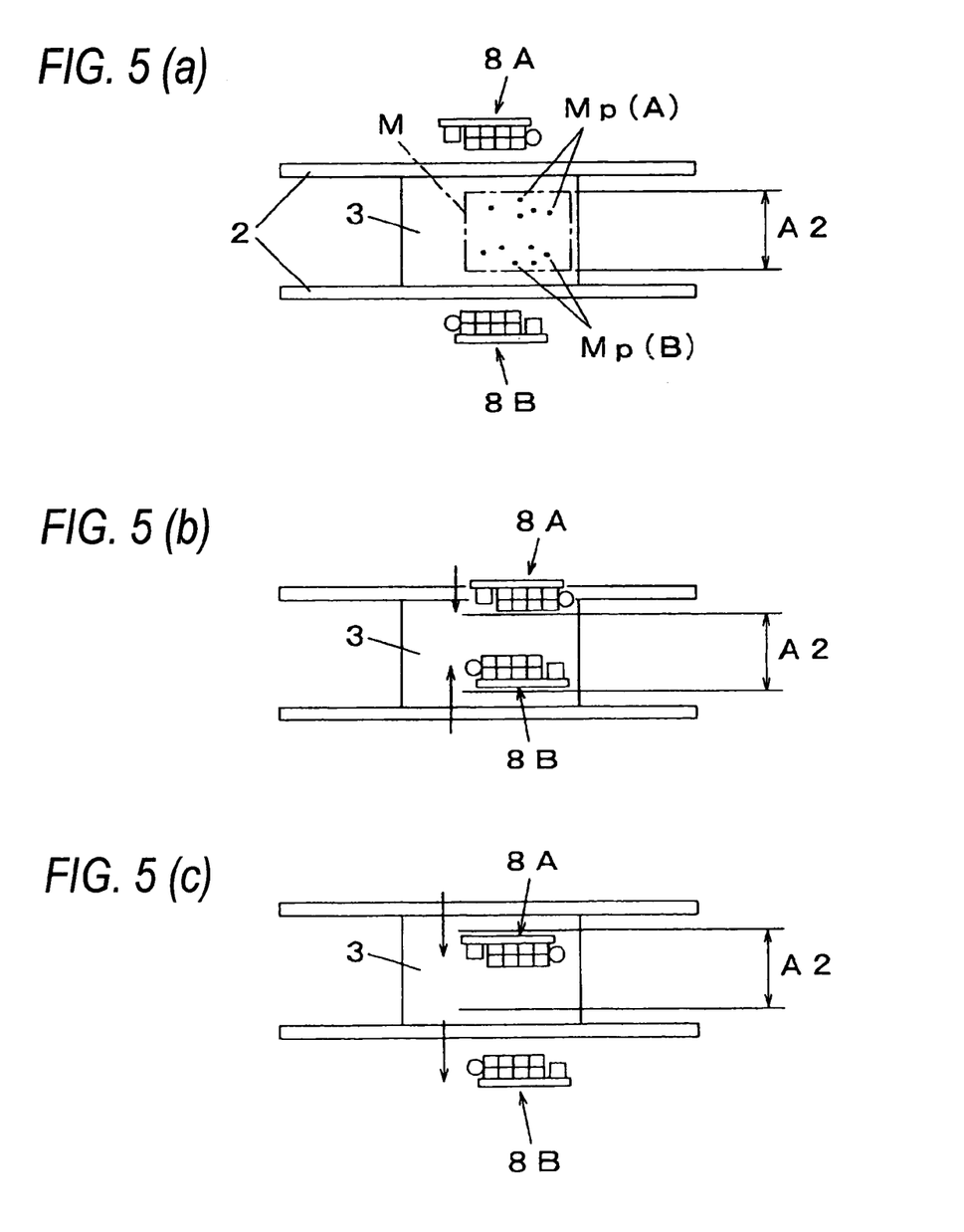
FIG. 5 is an explanatory view of an exclusive operating region of the electronic component placement device according to one embodiment of the present invention.

Next, in FIG. 5, when the head interference area is set using the substrate 3 having the placing points Mp (A), Mp (B) as a subject on which the head interference area is set in the same manner as the example shown in FIG. 4, in place of setting the whole range of the substrate 3 as an exclusive subject, as shown in FIG. 5(a), a width range of a placing region M which contains the placing points Mp (A), Mp (B) is set as a head interference area A2. The placing region M is set based on component placement position information which is stored in the placing data storing part 21.

When the head interference area A2 is set in this manner, in the component transfer and mounting operation, the advancement of two mounting heads into the head interference area A2 at the same timing is not allowable. However, different from the example shown in FIG. 4, when the B head 8B is performing the mounting of components within the head interference area A2, although the A head 8A is not allowed to advance into the head interference area A2, as shown in FIG. 5(b), the A head 8A is allowed to advance to a position extremely close to the outside of the head interference area A2 on the substrate 3 and to stand by there.

Then, as shown in FIG. 5(c), when the B head 8B is retracted from the head interference area A2, the A head 8A advances into the head interference area A2 from the position extremely close to the outside of the head interference area A2 thus performing the mounting operation immediately. That is, in this example, the setting of the head interference area A2 which constitutes the exclusive operating region is performed for every type of substrate based on the component mounting position information on the substrate 3 which is transported to the placing stage.

Figure 6:
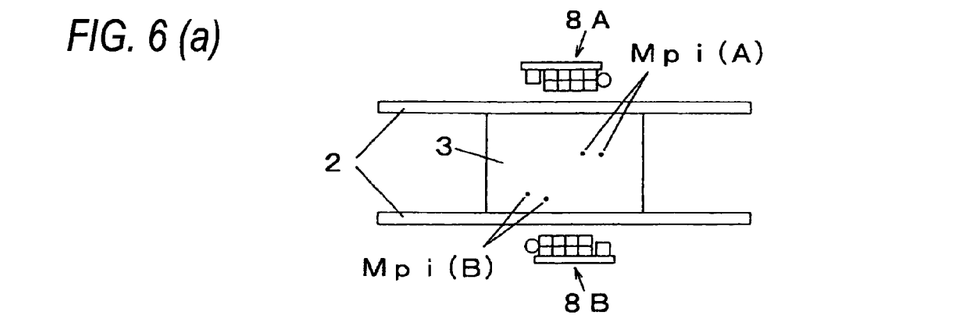
FIG. 6 is an explanatory view of an exclusive operating region of the electronic component placement device according to one embodiment of the present invention.

Further, FIG. 6 shows an example in which the setting of the head interference area is performed dynamically. In the examples shown in FIG. 4 and FIG. 5, the head interference areas A1, A2 are fixedly set with respect to the substrate 3 which becomes the subject on which the electronic components are placed. To the contrary, in the example shown in FIG. 6, the head interference area is set such that the head interference area differs for every individual operations that the A head 8A and the B head 8B respectively pick up the electronic components from the respective component supply sections 4A, 4B and transfer and mount the electronic components on the substrate 3, that is, every placing turn that the mounting head performs one reciprocating motion between the component supply section and the substrate.

For example, out of the plurality of placing points on the substrate 3, as shown in FIG. 6(a), when the A head 8A and the B head 8B respectively perform the component placement operation using the placing points Mpi(A), Mpi(B) as subjects at the ith placing turn respectively, as shown in FIG. 6(b), the head interference areas Ai(A), Ai(B) which correspond to the placing points Mpi(A), Mpi(B) are set.

Here, the head interference area Ai(A) is an exclusive operating region which is set to prevent the occurrence of a state that the A head 8A interferes with the B head 8B which advances to a position above the substrate 3 for placing the electronic components on the placing point Mpi (B), wherein the A head 8A is not allowed to advance in the inside of the head interference area Ai(A). Further, the head interference area Ai(B) is an exclusive operating region which is set to prevent the occurrence of a state that the B head 8B interferes with the A head 8A which advances to a position above the substrate 3 for placing the electronic components on the placing point Mpi (A), wherein the B head 8B is not allowed to advance in the inside of the head interference area Ai(B).

Then, when the placing operation progresses, and out of the plurality of placing points on the substrate 3, as shown in FIG. 6(c), when the A head 8A and the B head 8B respectively perform the component placement operation using the placing points Mpj(A), Mpj(B) as subjects at the jth placing turn respectively, as shown in FIG. 6(d), the head interference areas Ai(A), Ai(B) which correspond to the placing points Mpj (A), Mpj (B) are set. That is, in this example, the setting of the head interference area which constitutes the exclusive operating region is performed such that the head interference area is set, for every placing turn in which the A head 8A and the B head 8B perform one reciprocating motion between the substrate 3 and the component supply sections 4A, 4B in the component transfer and mounting operation, corresponding to the placing points in the placing turn, that is, based on the component mounting position information which is stored in the placing data storing part 21.

In this manner, by setting the head interference areas with respect to respective mounting heads corresponding to the placing points which become subjects to be placed in parallel simultaneously in one placing turn, even when the A head 8A and the B head 8B advance to positions above the substrate 3 at the same timing, there is no possibility that the A head 8A and the B head 8B interfere with each other and can mount the electronic components to the respective placing points as target places where the components are placed. Here, FIG. 6 shows the case in which both of the A head 8A and the B head 8B can advance to the positions above the substrate 3 at the same timing. However, such a state is not always guaranteed. For example, depending on the positions of the placing points, there may be a case in which the one-side mounting head may have to stand by outside the substrate 3.

Figure 7:
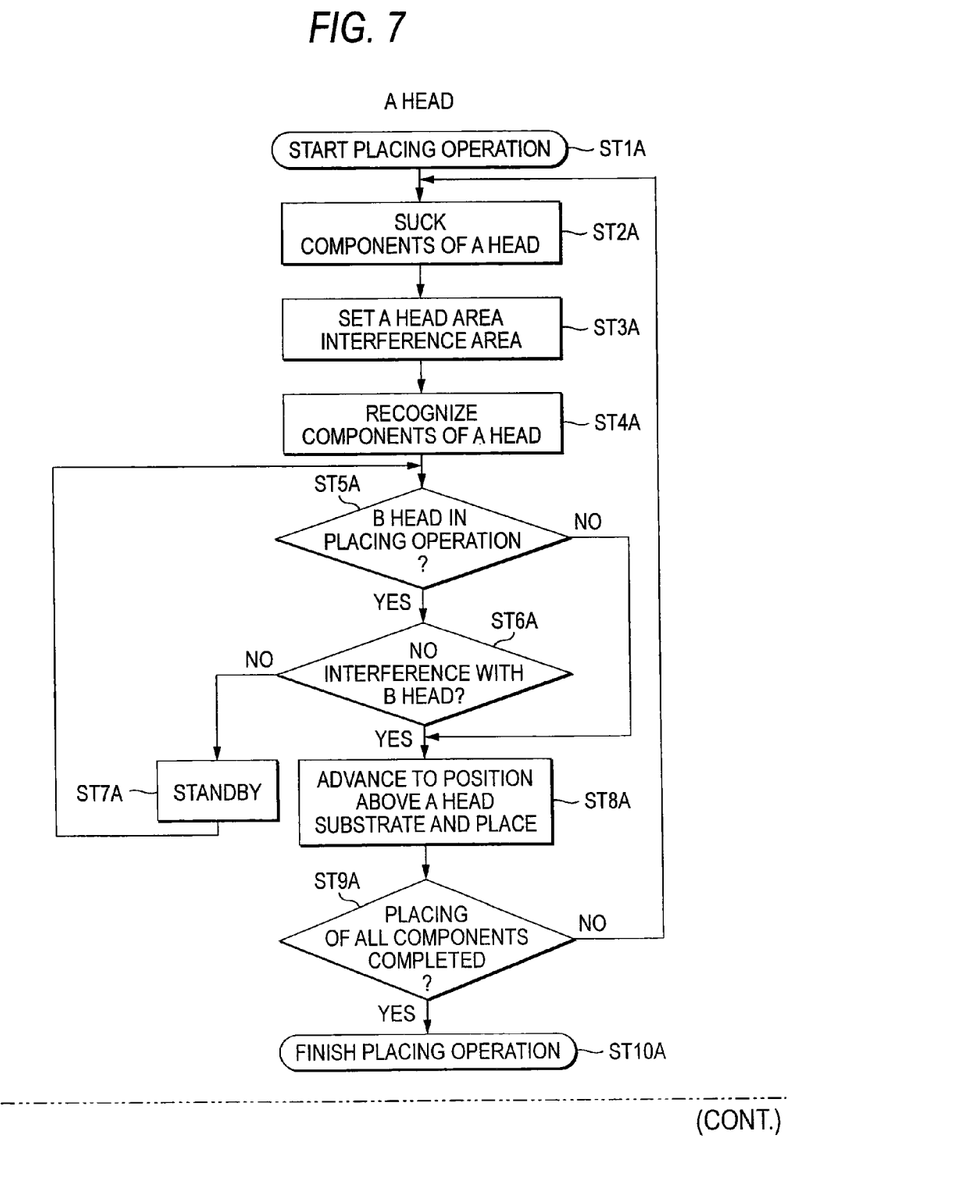
FIG. 7 is a flow chart of a placing operation of the electronic component placement device according to one embodiment of the present invention.

The electronic component placement device has the above-mentioned constitutions and the component transfer and mounting operation (placing operation) is explained in conjunction with a flow chart shown in FIG. 7. The flow shown in FIG. 7 shows the operation in which the electronic components are picked up from the plurality of component supply sections 4A, 4B using the A head 8A and the B head 8B and transfers and mounts the electronic components on the substrate 3 in the inside of the same placing stage.

When the placing operation is started (ST1A, 1B), first of all, the electronic components are sucked from the component supply section 4A by the A head (ST2A), and parallel to such an operation, the electronic components are sucked from the component supply section 4B by the B head (ST2B). Next, the setting of the A head interference area (ST3A) and the setting of the B head interference area (ST3B) are performed. Here, as in the examples shown in FIG. 4 and FIG. 5, when the head interference areas are fixedly set with respect to one substrate, the initially set head interference areas are maintained until the completion of the placing operation which uses the substrate as the subject to be placed. Further, as in the examples shown in FIG. 6, when the head interference areas are dynamically set, these steps are repeatedly executed for respective placing operations.

Next, in the course of the movement of the A head 8A and the B head 8B from the component supply sections 4A, 4B to the substrate 3, the A head component recognition (ST4A) and the B head component recognition (ST4B) are performed. That is, the electronic components which are held by the respective mounting heads are recognized by imaging using the component recognition cameras 10. Next, the confirmation of the state of another head is performed. That is, in the A head 8A, whether the B head 8B is performing the placing operation on the substrate 3 or not is confirmed (ST5A), while in the B head 8B, whether the A head 8A is performing the placing on the substrate 3 or not is confirmed (ST5B).

Here, when another head is not performing the placing, the A head 8A advances to a position above the substrate 3 and performs the placing of the holding electronic components (ST8A), while the B head 8B advances to a position above the substrate 3 and performs the placing of the holding electronic components (ST8B). Further, when it is confirmed that another head is performing the placing, the presence or the non-presence of the positional interference with another head is determined by the head interference confirmation part 23. That is, in the A head 8A, the non-presence or the presence of the interference with the B head 8B is determined (ST6A), while in the B head 8B, the non-presence or the presence of the interference with the A head 8A is determined (ST6B). It is needless to say that the determination of the presence or the non-presence of the interference with another head executed here may differ depending on the mode of predetermined head interference area.

For example, when the head interference area is fixedly set with respect to one substrate 3 as shown in FIG. 4 and FIG. 5, when another head is performing the placing, it is determined automatically that there exists the possibility of interference with another head and the head stands by (ST7A, ST7B). Here, in the example shown in FIG. 4, the standby position is arranged outside the substrate 3, while in the example shown in FIG. 5, the standby position is arranged outside the placing region M. Further, when the head interference area is dynamically set as shown in FIG. 6, the presence or the non-presence of interference with another head is determined by reference to the head interference area which is set for every placing turn (ST3A, ST3B).

Then, when it is determined that the interference with another head is not present (ST6A, ST6B), the A head 8A advances to a position above the substrate 3 and performs the placing of the holding electronic components (ST8A), while the B head 8B advances to a position above the substrate 3 and performs the placing of the holding electronic components (ST8B). Then, it is determined whether the placing of all components is completed or not (ST9A, ST9B), and when components which are not placed exist, the procedure returns to (ST2A, ST2B) and, thereafter, the substantially equal steps are repeatedly executed. Next, in step (ST9A, ST9B), the completion of the placing of all components is confirmed and the placing operation is completed (ST10A, ST10B).

As explained above, according to the present invention, in the component transferring and mounting operation using the mounting heads, out of the plurality of mounting heads in the placing stage, the setting processing of the exclusive operating region which allows the access of only the specific mounting heads is executed. Accordingly, in the component mounting operation, it is possible to rationally set the accessible region without causing the interference of one mounting head with another mounting head thus shortening the placing tact time by excluding the wasteful standby time of the mounting heads.

This application is based upon and claims the benefit of priority of Japanese Patent Application No. 2005-238166 filed on Aug. 19, 2005, the contents of which are incorporated herein by reference in its entirety.

INDUSTRIAL APPLICABILITY

The electronic component placement method of the present invention possesses the advantages that the placing method can rationally set the accessible region without causing the interference of one mounting head with another mounting head in the component mounting operation and the placing tact time can be shortened by eliminating the wasteful standby time of the mounting heads whereby the present invention is applicable to the placing of the electronic components by the electronic component placement device having the constitution in which the electronic components are picked up from the plurality of component supply sections using the plurality of mounting heads.

The invention claimed is:

1. An electronic component placement method comprising the steps of:
    picking up electronic components from a plurality of component supply sections, each supplying electronic components, using a plurality of mounting heads which are provided corresponding to the respective component supply sections,
    transferring the electronic components in a same placing stage using the mounting heads; and
    mounting the electronic components on a substrate in a same placing stage,
    wherein in performing the component transferring and mounting operations using the mounting heads, in the placing stage, processing for setting an exclusive operating region which allows an access of only specific mounting heads out of the plurality of mounting heads is executed,
    wherein the setting of the exclusive operating region is performed, for each placing turn in which the mounting heads perform one reciprocating motion in the component transferring and mounting operation, based on component mounting position information in each placing turn.

2. An electronic component placement method according to claim 1, wherein one mounting head out of the plurality of mounting heads is retracted after finishing the mounting of components within the exclusive operating region and, thereafter, another mounting head out of the plurality of mounting heads progresses into the inside of the exclusive operating region.

3. An electronic component placement method according to claim 1, wherein the exclusive operating region is set for each mounting head in the plurality of mounting heads, and the presence or the non-presence of the interference of the mounting head with another mounting head is determined, and when it is determined that there is no interference, each mounting head progresses on the substrate and places the electronic component.

4. An electronic component placement method according to claim 1, wherein the setting of the exclusive operating region is performed so that a width of the exclusive operating region in a direction perpendicular to a direction of transferring the electronic components differs based on the component mounting position information.

5. An electronic component placement method according to claim 1, wherein the setting of the exclusive operating region is performed so that a width of the exclusive operating region in a direction perpendicular to a direction of transferring the electronic components differs for the each placing turn based on the component mounting position information.

6. An electronic component placement method according to claim 1, wherein the setting of the exclusive operating region is performed so that a width of the exclusive operating region is smaller than a width of the substrate in a direction perpendicular to a direction of transferring the electronic components.

7. An electronic component placement method according to claim 6, wherein the setting of the exclusive operating region is performed so that a width of the exclusive operating region differs based on component mounting position information of substrates which are transferred to the placing stage for respective kinds of the substrates.

8. An electronic component placement method according to claim 6, wherein the setting of the exclusive operating region is performed so that a width of the exclusive operating region differs for each placing turn in which the mounting heads perform one reciprocating motion in the component transferring and mounting operation.

9. An electronic component placement method according to claim 1, wherein the electronic components are mounted on a substrate positioned on a single transporting passage in the same placing stage using the plurality of mounting heads.

10. An electronic component placement method according to claim 1, wherein the setting of the exclusive operating region is performed based on component mounting position information of substrates which are transferred to the placing stage for respective kinds of the substrates.

11. An electronic component placement method according to claim 1, wherein the exclusive operating region differs for every placing turn in which the mounting heads perform one reciprocating motion in the component transferring and mounting operation.

* * * * *